United States Patent
Hohle et al.

(10) Patent No.: US 7,169,531 B2
(45) Date of Patent: Jan. 30, 2007

(54) PHOTORESIST SUITABLE FOR USE IN 157 NM PHOTOLITHOGRAPHY AND INCLUDING A POLYMER BASED ON FLUORINATED NORBORNENE DERIVATIVES

(75) Inventors: Christoph Hohle, Bubenreuth (DE); Ralph Dammel, Flemington, NJ (US); Michael Francis Houlihan, Millington, NJ (US)

(73) Assignees: Infineon Technologies, AG, Munich (DE); AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/974,726

(22) Filed: Oct. 28, 2004

(65) Prior Publication Data

US 2005/0170279 A1    Aug. 4, 2005

(30) Foreign Application Priority Data

Oct. 30, 2003   (DE) ................. 103 50 685

(51) Int. Cl.
*G03F 7/004*   (2006.01)
*G03F 7/30*    (2006.01)

(52) U.S. Cl. .................. 430/270.1; 430/326; 430/905; 430/907

(58) Field of Classification Search ............. 430/270.1, 430/905, 907, 910, 326
See application file for complete search history.

(56) References Cited

U.S. PATENT DOCUMENTS

| | | | |
|---|---|---|---|
| 6,548,219 B2 * | 4/2003 | Ito et al. ................... | 430/270.1 |
| 2002/0102490 A1 | 8/2002 | Ito et al. | |
| 2003/0165773 A1 * | 9/2003 | Harada et al. ........... | 430/270.1 |
| 2004/0053161 A1 * | 3/2004 | Kanna et al. ............ | 430/270.1 |
| 2004/0101787 A1 * | 5/2004 | Naito et al. ................. | 430/325 |
| 2004/0166434 A1 * | 8/2004 | Dammel et al. ......... | 430/270.1 |

FOREIGN PATENT DOCUMENTS

| | | |
|---|---|---|
| EP | 0 955 562 A1 | 11/1999 |
| EP | 1 319 981 A2 | 6/2003 |

OTHER PUBLICATIONS

Dammel et al., "Transparent Resins fro 157 nm Lithography," pp. 350-360.
Abstract of Patterson et al., "Polymers for 157-nm photoresist applications: a progress report", Proc. SPIE 3999, pp. 365-374.

* cited by examiner

*Primary Examiner*—John S. Chu
(74) *Attorney, Agent, or Firm*—Edell, Shapiro & Finnan, LLC

(57) ABSTRACT

A photoresist that is suitable for use in 157 nm photolithography includes a polymer based on fluorinated norbornene derivatives.

12 Claims, No Drawings

PHOTORESIST SUITABLE FOR USE IN 157 NM PHOTOLITHOGRAPHY AND INCLUDING A POLYMER BASED ON FLUORINATED NORBORNENE DERIVATIVES

CROSS REFERENCE TO RELATED APPLICATIONS

This application claims priority under 35 USC §119 to German Application No. DE 103 50 685.3, filed on Oct. 30, 2003, the entire contents of which are hereby incorporated by reference.

FIELD OF INVENTION

The invention relates to a photoresist which is suitable in particular for exposure to light having a wavelength of 157 nm, and a process for structuring substrates, in particular silicon wafers.

BACKGROUND

In order to increase the computational speed of processors and the storage volume of memory elements and to reduce the costs for the components, the semiconductor industry is developing chips which have increasingly small structures and hence an increasingly high density of components. A particular challenge is the reduction of the minimum structure size. To date, these requirements have been met in optical lithography by a change to increasingly short wavelengths. At a structure size of from 100 to 70 nm, however, the methods known to date which use wavelengths of 193 nm or shorter reach the limit of their resolution. The development of novel methods is therefore necessary. Optical lithography has particularly good prospects for technical usability, radiation having wavelengths of 157 nm being used for exposure since the chip manufacturers in this case can continue to use their extensive know-how in optical lithography. A substantial difficulty for the use of an exposure radiation having a wavelength of 157 nm is the insufficient transparency of the materials used to date. For technical use, the base polymer in these high-resolution resists must have as high transparency as possible, while the photochemicals with which, for example, an acid is produced in the resist must have a high quantum yield.

Some of the resists currently used for the production of microchips operate with chemical amplification. This results in a change in the chemical structure of the photoresist in a photoreaction owing to the exposure. In the case of a positive-working chemically amplified resist, for example, the exposure produces a strong acid, which results in a catalytic transformation or cleavage of the resist in a subsequent heating step. As a result of this chemical reaction, the solubility of the polymer in a developer is dramatically changed so that a substantial differentiation between exposed and unexposed parts is possible.

The structured photoresists can be used as a mask for further processes, such as, for example, dry etching processes. If the photoresist is used for structuring a medium present underneath, the photoresist arranged as the uppermost layer must have high resistance to etching.

As is already known, the low transparency of the known photoresists at a wavelength of 157 nm constitutes a substantial difficulty in the development of the 157 nm technology. With the currently known photoresists, layer thicknesses of about 50 nm can be realized. At present, photoresists in which the transparency of the polymer at a wavelength of 157 nm is improved by fluorination are being developed (cf. K. Patterson, M. Yamachika, R. Hung, C. Brodsky, S. Yamada, M. Somervell, B. Osborn, D. Hall, G. Dukovic, J. Byers, W. Conley, C. G. Willson, Proc. SPIE, 3999 (2000)). However, these polymers still have an absorption which is about 50 times higher than that of the polymers customary at present in the resists used technically for exposure to radiation having a wavelength of from 193 or 248 nm. With these highly fluorinated polymers, only layer thicknesses of up to a thickness of about 200 nm are achieved.

In addition to high transparency at a wavelength of 157 nm, the resists must meet further requirements for technical usability, such as, for example, a high contrast, good film formation properties and good developability in combination with low base solubility (dark ablation). Furthermore, the polymers of the photoresist should be capable of being prepared in as simple a manner as possible in order to avoid complex production processes which result in an increase in the costs of the photoresist.

Various theoretical methods have been developed for proposing, to a first approximation, suitable candidates for the polymers for exposure at 157 nm. One of these methods is the "Simple Transmission and Understanding and Prediction by Incremental Dilution", the so-called STUPID method (Dammel et al., Transparent Resin for 157 Lithography: Advances in Resist Technology XVIII, Proceedings of SPIE, Vol. 4345, 2001, 350–360). Inter alia, various norbornenes which are partly fluorinated are described there, including 6,6-difluoro-5-(trifluoromethyl)-5-hydroxybicyclo{2.2.1}heptane and 6,6-difluoro-5-(trifluoromethyl)-5-carboxybicyclo{2.2.1}heptane. (For the numbering of the norbornene ring, cf. Römpp Lexikon, 10th Edition, Georg Thieme Verlag, Stuttgart, New York, Volume 4, 1998, page 2949, key word: Norbornen [norbornene]). The polymers based on norbornenes described in Dammel et al. were not mentioned. Polymerization of 5,5'-disubstituted norbornene is virtually impossible according to Dammel et al. (ibid, 351).

US2002/0102490 proposes copolymerizing fluorinated norbornenes with fluorinated acrylic acid derivatives. It is therefore an object of the invention to provide further polymers which are based on fluorinated norbornenes and which have high contrast, good film formation properties and good developability in combination with low base solubility (dark ablation) and at the same time can be used for microlithography with exposure at 157 nm.

A further object of the invention is to provide polymers which have an absorption of less than 1/µm.

The object is achieved by a chemically amplified photoresist, comprising: a polymer which has acid-labile groups which are eliminated under the action of an acid and liberate polar groups which result in an increase in the solubility of the polymer in aqueous alkaline developers, the polymer having a repeating unit which is derived from norbornene and the norbornene ring being at least difluorinated and/or being substituted by fluoroalkyl groups; a photo acid generator; and a solvent.

The advantage of the polymer according to the invention is that it has an absorption of less than 1/µm. This low absorption is very surprising and is not suggested by the prior art. Moreover, the polymer according to the invention has very good resistance to etching and is therefore outstandingly suitable for use in photoresists which are exposed at 157 nm.

As a result of the introduction of a repeating unit derived from a norbornene which is at least partly fluorinated and/or substituted by fluoroalkyl groups into the polymer, the transparency of the photoresist according to the invention is substantially increased, permitting greater layer thicknesses of the photoresist. The polymer according to the invention has acid-labile groups in order to be able to change the polarity of the desired parts. The acid-labile groups can be introduced after the polymerization of the polymer according to the invention, for example by reaction of the polar groups contained in the polymer with acid-labile groups.

The polymer according to the invention can, however, also be prepared by polymerization of a mixture of a monomer having acid-labile groups and of a monomer having the polar groups. The acid-labile groups are then present immediately after the polymerization in the polymer.

The further components of the photoresist are in general already known. Thus, all compounds which liberate acid on exposure to radiation can be used as photo acid generators. Onium compounds, as described, for example, in EP 0 955 562 A1, are advantageously used. Preferably used photo acid generators are ionic compounds in the form of sulfonium salts and iodonium salts.

Methoxypropyl acetate, cyclopentanone, cyclohexanone, γ-butyrolactone, ethyl lactate, diethylene glycol, diethyl ether, ethylene glycol dimethyl ether, dimethyl ether or a mixture of at least two of these solvents can be used as solvents for the resist. However, it is in general possible to use all conventional solvents or mixtures thereof in which the components of the resist can be dissolved to give a clear, homogeneous solution having a long shelf life, and which ensure a good layer quality on exposure of the substrate to radiation.

In addition to said components, the photoresist can also contain further components. Thus, the photoresist may additionally contain a thermal acid generator. Suitable thermal acid generators are, for example, benzylthiolanium compounds.

Furthermore, components which advantageously influence the resist system with regard to resolution, film formation properties, shelf life, radiation sensitivity, pot life aspects, etc. can also be added as additives.

The polymer contained in the photoresist according to the invention contains acid-labile side groups which impart to the polymer a low solubility in polar solvents. By the catalytic action of acid and optionally a simultaneous thermal treatment, polar groups are produced on the polymer. For example, the following groups can be used as acid-labile groups: tert-alkyl ester, tert-butoxycarbonyloxy, tert-butoxycarbonylmethyl (BocMe), tetrahydrofuranyl, tetrahydropyranyl, tert-butyl ether, lactone or acetal groups. tert-Butyl ether groups and in particular bis(trifluoromethyl)-tert-butyl ether are particularly preferred. These acid-labile groups are preferably at least partly fluorinated, i.e. one or more of the hydrogen atoms contained in the groups are substituted by fluorine atoms. Accordingly, carboxyl groups or hydroxyl groups then act as polar groups, which are liberated after elimination of the acid-labile groups, when corresponding monomers were polymerized.

The repeating unit derived from the at least partly fluorinated norbornene is represented by the following general formula I:

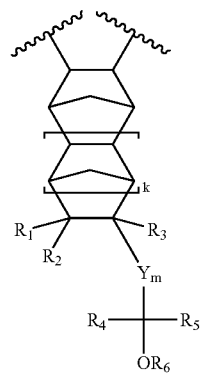

Formula I in which R1–R5, independently of one another, are H, F and/or a fluorine-substituted alkyl group having preferably 1–6 carbon atoms;

R6 is H or an acid-labile group, the acid-labile group preferably being tert-alkyl ester, tert-butoxycarbonyloxy, tetrahydrofuranyl, tetrahydropyranyl, tert-butyl ether, lactone or acetal groups, and preferably one or more or all of the hydrogen atoms contained in the acid-labile groups being substituted by fluorine atoms;

Y is any desired group, for example an alkyl group having 1 to 6 carbon atoms, which may be partly or completely fluorinated and may have, inter alia, functional groups such as acetal, ketal, carboxyl or ether groups; m is 0 or 1 and k is 0 or an integer from 1 to 3, R1–R3 together having at least two fluorine or fluoroalkyl groups. In a preferred embodiment, R4 and R5 are trifluoromethyl groups. In a further embodiment, R1 and R2 are fluorine atoms. In a further embodiment, m is 1 and k is 0. In a particularly preferred embodiment, R1–R3 are fluorine atoms, R4 and R5 are trifluoromethyl groups, Y is a $CH_2$—$CH_2$ group, R6 is H or an acid-labile group, m is 1 and k is 0. The polymer according to the invention has an average molecular weight of from 1000 to 200 000. The polymer according to the invention may contain further monomers if the monomers do not absorb very strongly at the exposure wavelength. Preferably, the further monomers are present in a proportion by weight of less than 30% by weight, based on the polymer, and more preferably less than 10% by weight.

The repeating units derived from the at least partly fluorinated norbornene preferably have acid-labile ethers or acid-labile esters. Inter alia, however, all the acid-labile groups mentioned for R6 can be used as the acid-labile group. The tert-butyl ether groups, tert-butyl ester groups or BocMe groups are particularly preferably used.

The polymer according to the invention may also have different repeating units, which can be represented by the general formula I. One repeating unit may have, for example, the acid-labile groups while the further repeating units may have polar groups.

The proportion of the first repeating units which have acidic labile groups can be freely chosen.

The photoresist according to the invention, comprising the polymer according to the invention, has the following composition: polymer according to the invention: 1–50% by weight, preferably 2–20% by weight; photo acid generator: 0.001–10% by weight, preferably 0.001–0.1% by weight; solvent: 50–99% by weight, preferably 88–98% by weight.

The increased transparency of the photoresist according to the invention to light of very short wavelength permits the preparation of structures having dimensions of less than 100 nm. The invention therefore also relates to a process for structuring substrates, the substrate being coated with the photoresist described above, so that a photoresist film is obtained. The photoresist film is exposed section by section to light having a wavelength of less than 200 nm, and the exposed photoresist film is then developed, a structure being contained in the photoresist. The structure is then transferred to the substrate.

The process according to the invention is carried out in a manner such that first the photoresist described above is applied to the substrate by conventional methods, for example by spin-coating, spraying on or dipping methods. The solvent is then removed, for which purpose the substrate with the resist film is, for example, heated. An advantageously used substrate is a silicon wafer, in which components may also already be integrated.

Exposure of the photoresist film to light is then effected, for which purpose the conventional methods can likewise be used. The exposure to light can be effected, for example, by means of a photomask or by interference methods or by direct irradiation with focused electrons or ions. Light having a very short wavelength is used for the exposure. Preferably, the photoresist film is exposed to light having a wavelength of 157 nm. In the exposed parts, an acid is liberated from the photo acid generator of the photoresist, a latent image of the desired structure being formed. After the exposure of the resist film to light, a contrasting step is carried out, in which the latent image is amplified and is impressed into the polymer of the photoresist. For this purpose, the substrate with the exposed resist film is heated, generally to a temperature of from 80 to 200° C. Under the catalytic influence of the acid, the acid-labile groups are eliminated from the polymer and the polar groups are liberated. The polymer now also has high polarity and hence a high solubility in the polar solvent or a low solubility in nonpolar solvents. The development of the chemical profile is effected using an aqueous alkaline developer solution, for example using a 2.38% strength solution of tetramethylammonium hydroxide in water. As a result, the exposed parts are dissolved away and a positive relief pattern is produced in the resist film. The substrate is now bare in the exposed parts, whereas the unexposed parts are still protected by the solid resist film. The structure is then transferred to the substrate. Conventional etching methods can be used for this purpose. Particularly preferably, the structure is transferred into the plasma by a dry plasma etching method.

The invention is explained in more detail with reference to the preparation examples. General working method: Unless stated otherwise, all proportions are % by weight, the temperature is stated in ° C. and the pressure is atmospheric. All starting materials are commercially available or are synthesized according to known synthesis examples. The NMR spectra have been recorded using a Bruker Avance300, Avance300(13C, 19F) and Jeol JNM-EX400 (1H). The IR spectra have been recorded using a Bruker IFS85.

EXAMPLE 1

Preparation of 4-bicyclo{2.2.1}hept-2,3,3-trifluoro-5-en-2-yl-1,1,1-trifluoro-2-(trifluoromethyl)butan-2-ol ("3F-NBHFA" (1))

3F-NBHFA (1) is prepared as follows:

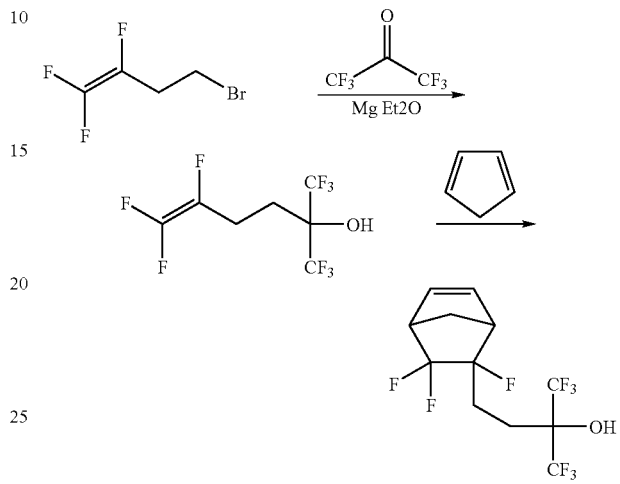

a) Preparation of 1,1,1,5,6,6-pentafluoro-2-trifluoromethylhex-5-en-2-ol:

4-Bromo-1,1,2-trifluoro-1-butene (40 g) was added dropwise to a suspension of magnesium turnings (5.15 g) in 100 ml of dry diethyl ether ($Et_2O$), the temperature being kept at about 10° C. The reaction mixture was stirred for 3 hours at room temperature and then cooled to 0° C. 40 g of the condensed hexafluoroacetone were then added dropwise. The reaction mixture was stirred overnight and the resulting Grignard product was eliminated with 6 N HCl. The suspension was washed three times with 100 ml of $Et_2O$, and the organic phases were combined, washed with water and dried over $MgSO_4$. Complete $Et_2O$ was then distilled off in vacuo. The product was then distilled over a Vigreux column as an ether complex (boiling point 104–120° C.). Yield 51 g (about 88%).

$^1$H-NMR ($CDCl_3$): 2.20 (2H, —$CH_2$—); 2.53–2.64 (2H, —$CH_2$—); 3.04 (1H, —OH); $^{13}$C-NMR ($CDCl_3$): 19.1 (—$CH_2$—); 25 (—$CH_2$—); 75.9 (C—OH); 123.1 (q, —$CF_3$); 127.4 (m, C—F); 152.9 (m 2 $CF_2$); $^{19}$F-NMR ($CDCl_3$): −176.0; −123.1; −103.9 (s,F); 76.9 (—$CF_3$). IR (NaCl): 3604, 3400 (OH), 1806 (C═C), 1306 (C—F), 1211 (C—O); 709.

b) Preparation of 3F-NBHFA (1)

Freshly distilled cyclopentadiene (3.2 g) and 100 mg of hydroquinone were added to 13.3 g of the 1,1,1,5,6,6-pentafluoro-2-trifluoromethylhex-5-en-2-ol-ether complex. The reaction mixture was stirred overnight, and the product was separated and was purified by means of distillation over a Vigreux column.

EXAMPLE 2

Metal-Catalyzed 3F-NBHFA Polymerization

Poly(3F-NBHFA) can be prepared by means of metal-catalyzed copolymerization using Ni or Pd as described in various PROMERUS patents. The absorption of the polymer is about 0.4/μm.

EXAMPLE 3

Introduction of the Acid-Labile Groups into poly(3F-NBHFA)

The acid-labile groups can be introduced into the polymer using activated derivatives of the target groups. The general reaction is shown below for the 3F-NBHFA polymer. The proportion of the acid-labile groups can be controlled by varying the molar ratio.

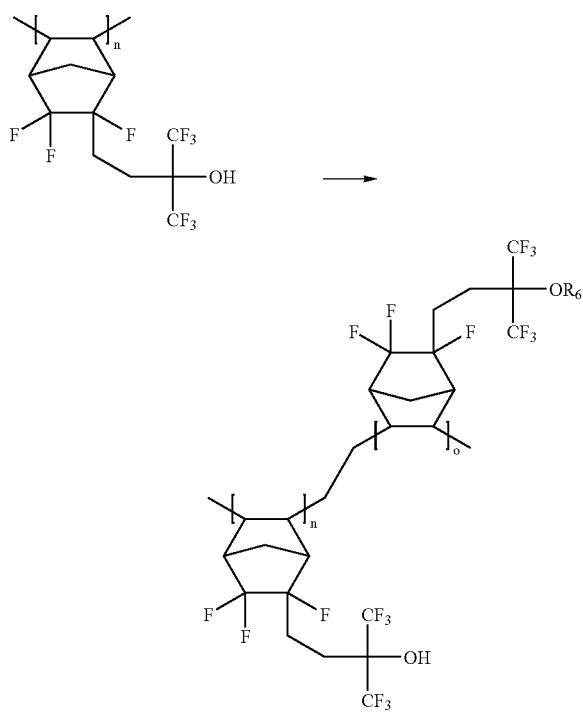

The acid-labile groups can, however, also be introduced into the monomer by blocking the polar groups with an acid-labile protective group. Instead of introducing the acid-labile groups only after the preparation of the polymer, the acid-labile groups can be introduced into the monomer. The polymer according to the invention can then be prepared from the mixture of monomers having acid-labile groups and monomers which have no acid-labile groups.

We claim:

1. A polymer comprising repeating units of the following general formula:

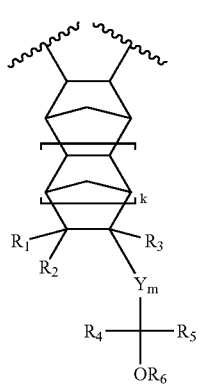

Formula I wherein:

each of R1–R5, independently of each other, is H, F or a fluorine-substituted alkyl group having preferably 1–6 carbon atoms;

R6 is an acid-labile group, including tert-alkyl ester, tert-butoxycarbonyloxy, tert-butoxycarbonylmethyl, tetrahydrofuranyl, tetrahydropyranyl, tert-butyl ether, lactone or acetal groups, and at least one of the hydrogen atoms contained in the acid-labile groups is substituted with fluorine atoms;

Y is a straight-chain or branched alkyl group including 1 to 6 carbon atoms, the straight-chain or branched alkyl group being at least partially fluorinated and including functional groups having acetal, ketal, carboxyl groups, ether groups, a hetero atom and/or a carbonyl group;

m is 0 or 1;

k is 0 or an integer from 1 to 3; and at least two of R1–R3 include at least one of a fluorine atom and a fluoroalkyl group.

2. The polymer of claim 1, wherein R4 and R5 are trifluoromethyl groups.

3. The polymer of claim 1, wherein R1 and R2 are fluorine atoms.

4. The polymer of claim 1, wherein:

m =1; and k=0.

5. The polymer of claim 1, wherein:

R1–R3 are fluorine atoms;

R4 and R5 are trifluoromethyl groups;

Y is a $CH_2$—$CH_2$ group;

R6 is H or an acid-labile group;

m =1; and k=0.

6. The polymer of claim 1, wherein the average molecular weight of the polymer is from 1000 to 200,000.

7. The polymer of claim 1, wherein the polymer includes other monomers in a proportion of less than 30% by weight of the polymer.

8. The polymer of claim 1, wherein the polymer includes other monomers in a proportion of less than 10% by weight of the polymer.

9. The polymer of claim 1, wherein the polymer includes different repeating units of the general formula I.

10. A photoresist comprising a polymer as recited in claim 1, a photo acid generator, and a solvent.

11. A process for structuring substrates, comprising:

coating a substrate with a photoresist as recited in claim 10 to obtain a photoresist film;

exposing the photoresist film in selected sections to light having a wavelength of less than 200 nm;

developing the exposed photoresist film to form a structure; and transferring the structure to the substrate.

12. The process of claim 11, wherein the photoresist film is exposed to light having a wavelength of 157 nm.

* * * * *